United States Patent
Bultitude et al.

(10) Patent No.: US 9,287,844 B2
(45) Date of Patent: Mar. 15, 2016

(54) SURFACE MOUNTABLE MULTI-LAYER CERAMIC FILTER

(75) Inventors: John Bultitude, Simpsonville, SC (US); Mark R. Laps, Simpsonville, SC (US); James R. Magee, Simpsonville, SC (US); Lonnie G. Jones, Simpsonville, SC (US)

(73) Assignee: KEMET Electronics Corporation, Simpsonville, SC (US)

( * ) Notice: Subject to any disclaimer, the term of this patent is extended or adjusted under 35 U.S.C. 154(b) by 338 days.

(21) Appl. No.: 13/542,007

(22) Filed: Jul. 5, 2012

(65) Prior Publication Data

US 2013/0009727 A1 Jan. 10, 2013

Related U.S. Application Data

(60) Provisional application No. 61/505,382, filed on Jul. 7, 2011, provisional application No. 61/505,390, filed on Jul. 7, 2011.

(51) Int. Cl.

| | |
|---|---|
| *H03H 7/01* | (2006.01) |
| *H01F 41/04* | (2006.01) |
| *H01P 1/203* | (2006.01) |
| *H03H 3/00* | (2006.01) |
| *H03H 1/00* | (2006.01) |
| *H01G 4/40* | (2006.01) |
| *H03H 9/00* | (2006.01) |
| *H01F 17/00* | (2006.01) |

(52) U.S. Cl.
CPC ........... *H03H 7/0115* (2013.01); *H01F 41/046* (2013.01); *H01P 1/20345* (2013.01); *H03H 1/0007* (2013.01); *H03H 3/00* (2013.01); *H01F 2017/0026* (2013.01); *H01G 4/40* (2013.01); *H03H 9/00* (2013.01); *H03H 2001/0085* (2013.01); *Y10T 29/4913* (2015.01)

(58) Field of Classification Search
CPC ............... H03H 2001/0085; H03H 7/0115; H03H 1/0007; H01P 1/20345; H01F 1/046
USPC .................................................. 333/185, 175
See application file for complete search history.

(56) References Cited

U.S. PATENT DOCUMENTS

| | | | |
|---|---|---|---|
| 3,638,147 A | 1/1972 | Denes | |
| 4,821,005 A | 4/1989 | Kling | |
| 4,929,196 A * | 5/1990 | Ponn et al. | ............... 439/620.09 |
| 5,173,670 A | 12/1992 | Naito et al. | |
| 5,443,550 A * | 8/1995 | Yoneda et al. | ............. 73/114.32 |
| 6,045,747 A | 4/2000 | Holm | |

(Continued)

FOREIGN PATENT DOCUMENTS

| | | |
|---|---|---|
| EP | 0 841 748 A2 | 5/1998 |
| EP | 0841748 A2 | 6/2011 |

*Primary Examiner* — Benny Lee
*Assistant Examiner* — Rakesh Patel
(74) *Attorney, Agent, or Firm* — Joseph T. Guy; Perkins Law Firm, LLC (57) ABSTRACT

An improved electronic filter is provided with capacitance and integral inductance properties. The filter has a capacitor with first planer internal electrodes in electrical contact with a first termination and second planer internal electrodes in electrical contact with a second termination. A dielectric is between the first planer internal electrodes and the second planer internal electrodes. A third termination is provided and a conductive trace on a surface of the capacitor is between the third termination and the first termination. A ferromagnetic or ferrimagnetic material is coupled to the conductive trace.

36 Claims, 8 Drawing Sheets

(56) References Cited

U.S. PATENT DOCUMENTS

| | | |
|---|---|---|
| 6,346,865 B1 | 2/2002 | Callewart et al. |
| 7,795,995 B2 * | 9/2010 | White et al. ............... 333/134 |
| 2008/0039332 A1 * | 2/2008 | Bernstein et al. ............ 505/201 |
| 2011/0050358 A1 * | 3/2011 | Wang et al. .................... 333/32 |
| 2011/0148546 A1 | 6/2011 | Feichtinger |

* cited by examiner

SURFACE MOUNTABLE MULTI-LAYER CERAMIC FILTER

CROSS-REFERENCE TO RELATED APPLICATIONS

This application claims priority to U.S. Provisional Appl. No. 61/505,382 filed Jul. 7, 2011 and to U.S. Provisional Appl. No. 61/505,390 filed Jul. 7, 2011 both of which are incorporated herein by reference.

BACKGROUND

The present invention is related to filters suitable for filtering electronic signals, and particularly, AC noise from a DC signal. More specifically, the present invention is related to multi-layered ceramic filters.

Filtering of electronic signals is a widely practiced art typically practiced with filters such as discoidal filters, Pi filters, T filters, LC filters and the like. In general, the type of filter is chosen based on the filtration needs and one of the most common needs is to filter AC noise from DC filters.

Discoidal filters are commonly used where the discoidal filter is placed on the input line and contacted to ground. Placement of the filter is typically a manual operation which is not readily automated thereby significantly increasing the cost of devices containing discoidal filters. In the most demanding applications, such as on the leads of medical implantable devices, the leads must be hermetically sealed, typically in a can, and the can is grounded.

Surface mount filters are available which have some advantages over discoidal filters. Surface mount filters are typically 4 terminal capacitors with input and output terminals perpendicular to each other. This design dictates the relative location of the ground and signal traces which places a constraint on the circuit designer. The perpendicular design also complicates efforts to miniaturize the overall circuit size. As the components become smaller the distance between the signal and ground must be decreased to accommodate the filter terminations. Unfortunately, this increases the potential of arcing, particularly, in high voltage applications. The perpendicular orientation also makes the use of slotted boards impractical and radiation interference mitigation is not typically available.

Pi, T, and LC filters are widely used in either feed-through or surface mount configurations. The surface mount filters are preferred over feed-through when considering further miniaturization even though the radiation interference is superior in the feed-through configurations. The surface mount configurations comprise a magnetic inductor and a ceramic filter and integrating these components is a significant challenge. The magnetic inductor is typically ferrite or ferromagnetic materials which are not compatible with the materials used in multi-layered ceramic capacitors due to the sintering requirements of ceramic.

There has been an ongoing desire for a filter which is small in dimension yet which does not increase complexity in circuit design. There has also been an ongoing desire for a filter which is easily manufactured, is preferably surface mountable or imbeddable, and which can be adapted to various circuit requirements.

SUMMARY

It is an object of the invention to provide an electronic filter which is surface mountable and which allows flexibility in circuit design.

It is another object of the invention to provide an electronic filter which can take advantage of multi-layered ceramic capacitor manufacturing techniques to facilitate design and manufacture.

These and other advantages, as will be realized, are provided in an improved electronic filter. The filter has a capacitor with first planer internal electrodes in electrical contact with a first termination and second planer internal electrodes in electrical contact with a second termination. A dielectric is between the first planer internal electrodes and the second planer internal electrodes. A third termination is provided and a conductive trace on a surface of the capacitor is between the third termination and the first termination. A ferromagnetic or ferrimagnetic material is coupled to the conductive trace.

Yet another embodiment is provided in an improved electronic filter. The electronic filter has first planer internal electrodes in electrical contact with a first termination and second planer internal electrodes in electrical contact with a second termination wherein the first planer internal electrodes and the second planer internal electrodes are in a common plane. Third planer internal electrodes are interleaved with the plane of the first planer internal electrodes and the second planer internal electrodes. A dielectric is between the plane containing the first planer internal electrodes and adjacent second planer internal electrodes and the third plates.

Yet another embodiment is provided in a method of making an electronic filter comprising:
forming a stacked arrangement comprising first conductive plates in electrical contact with first terminations and second conductive plates in electrical contact with second terminations and a dielectric between the first conductive plates and the second conductive plates;
forming a third termination on the stacked arrangement; and
forming a conductive trace on the stacked arrangement wherein the conductive trace is electrically connected between the first trace and the second trace and the conductive trace is magnetically coupled to a ferromagnetic or ferrimagnetic material.

DESCRIPTION

The present invention is directed to a multi-layered ceramic filter. More specifically, the present invention is related to a multi-layered ceramic filter which is easily manufactured and which avoids the sintering problems typically encountered in components comprising both a multi-layered ceramic capacitor and an integral inductor.

The invention will be described with reference to the figures which form an integral, non-limiting component of the disclosure. Throughout the specification similar elements will be numbered accordingly.

Figure 1:
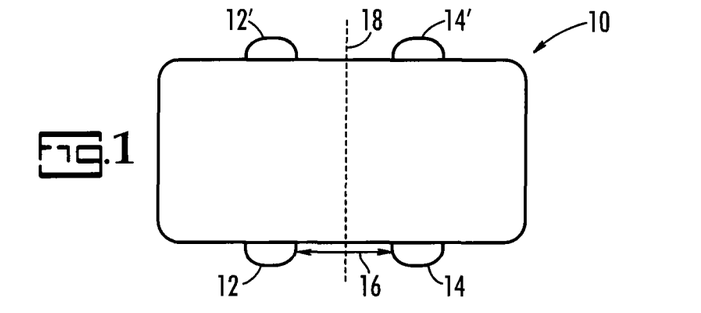
FIG. 1 is a top schematic view of an embodiment of the invention.
Figure 2A:
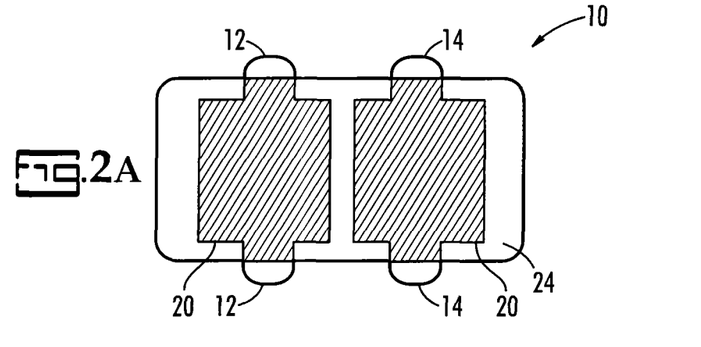
FIGS. 2A, 2B and 3 are plan views of internal electrodes of an embodiment of the invention.
Figure 2B:
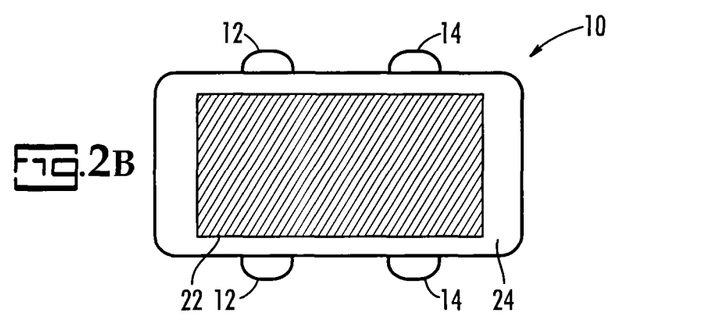
Figure 3:
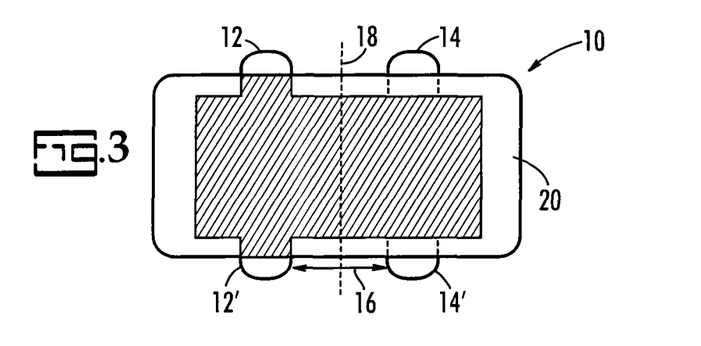

An embodiment of the invention is illustrated in schematic top view in FIG. 1 and will be described with reference to FIGS. 1, 2A, 2B and 3. The embodiment of FIG. 1 can employ electrodes as illustrated in cross-sectional schematic top view in FIGS. 2A and 2B wherein the electrode illustrated in FIG. 2B is a floating electrode between layers wherein each layer contains coplanar electrodes of opposite polarity as illustrated in cross-sectional schematic top view in FIG. 2A. Alternatively, the embodiment of FIG. 1 can employ electrodes as illustrated in FIG. 3 wherein the electrodes are stacked with alternate polarity as would be realized to one of skill in the art. In FIG. 1, a filter, 10, comprises ground terminals, 12, 12' and signal terminals, 14, 14' wherein at least one of each is preferably disposed on a common side of the filter. The ground terminals and power terminals are separated on a common face by a distance, 16, and are preferably in a centrosymmetric arrangement relative to a center line, 18. With reference to FIGS. 2A and 2B, the inner electrodes, 20, connected to the signal terminals, 14, are separated from the inner electrode of the ground terminals, 12, by dielectric, 24. With reference to FIG. 3 adjacent plates are separated by dielectric as would be realized to one of skill in the art. Repeating the electrode prints allows a multilayered ceramic capacitor to be formed between the ground and power terminals as well known in the art. The centrosymmetric arrangement is not necessary for demonstration of the teachings but is highly preferable in practice since this eliminates incorrect orientation due to the ground and signal terminals being interchangeable in some embodiments. Terminals disposed diagonally would be suitable for demonstration of the invention, however, diagonal terminals are not suitable for use with slotted circuit boards. The filter comprises alternating conductive layers with the ground and power portions each representing a capacitive couple as will be realized.

In one embodiment a single capacitor is formed, as would be achieved using plates as in FIG. 3, and the resulting capacitor would have a voltage capability limited to the breakdown of the dielectric material between the adjacent electrodes. Floating electrodes, as would be achieved using plates of FIGS. 2A and 2B, allow at least two capacitors to be formed with a shared floating electrode. This inner electrode design divides the applied voltage between the two capacitors allowing a higher voltage rating to be realized although capacitance is lowered since;

$$1/Cap._{total} = 1/Cap_1 + 1/Cap_2$$

The number of inner electrodes can be extended to realize more that two capacitors in series thereby achieving and even higher voltage capability for a given dielectric separation thickness. While illustrated with four external terminations, two ground and two power, any even number of external terminations can be employed. In some embodiments it is preferable to have only two terminals, one ground and one power, on a common side to allow for face down mounting of the filter.

Figure 4:
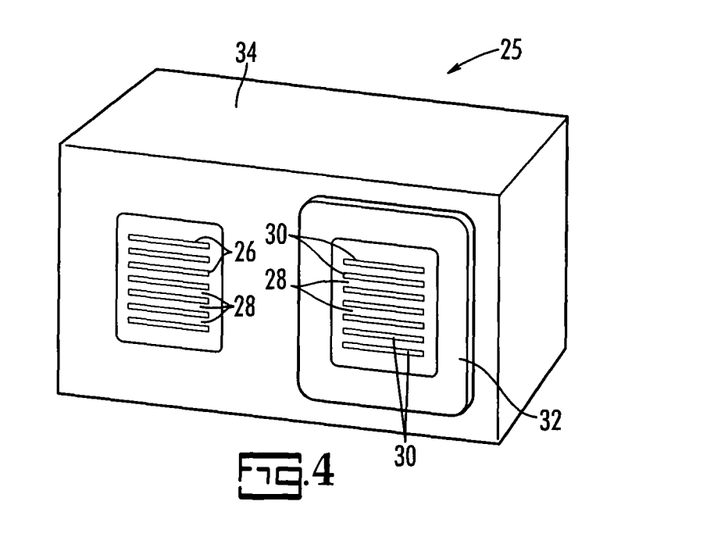
FIG. 4 is a bottom perspective schematic view of an embodiment of the invention.

An embodiment of the invention is illustrated in bottom perspective schematic view in FIG. 4. In FIG. 4 the filter, 25, comprises internal ground electrodes, 26, with dielectric, 28, between the electrodes. As would be realized the internal ground electrodes may be terminated for mounting to a circuit trace. Internal power electrodes, 30, with dielectric, 28, between the electrodes, are surrounded by an insulator, 32. The filter is preferably encased within a conductor, 34, which provides radiation filtration properties. In one embodiment the ground terminations and conductive encasement can be commonly grounded to filter out both transmitted and radiated interference within the same component. The conductive encasement functions as a Faraday cage thereby excluding radiated interference. The embodiment illustrated in FIG. 4 can be a surface mount with the internal conducting layers parallel to the surface or in a face down mount with the internal conducting layers perpendicular to the surface. In a face down mount it is preferable to only have external terminations on the downward face. The embodiment illustrated in FIG. 4 is also suitable for use as an embedded capacitor which provides some advantages since the ground planes of the resulting embedded circuit can be arranged to obtain shielding from radiation interference which is a potential source of additional noise.

Figure 5:
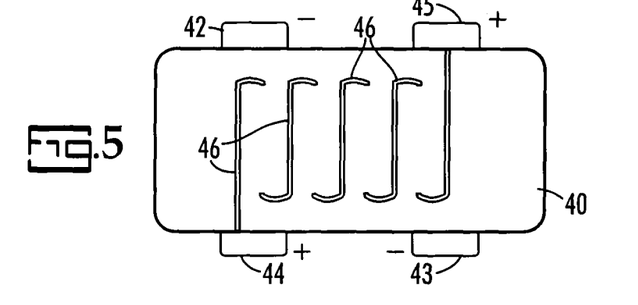
FIG. 5 is a top perspective schematic view of an embodiment of the invention.
Figure 6:
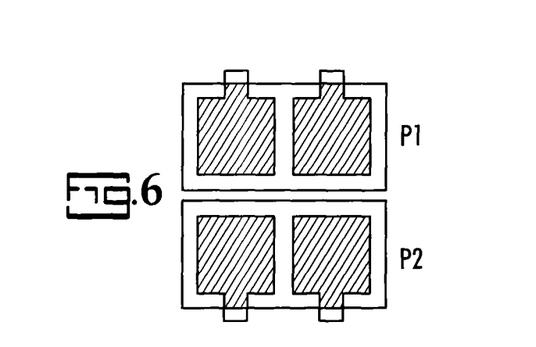
FIG. 6 is a plan view of an internal electrode of an embodiment of the invention.
Figure 7:
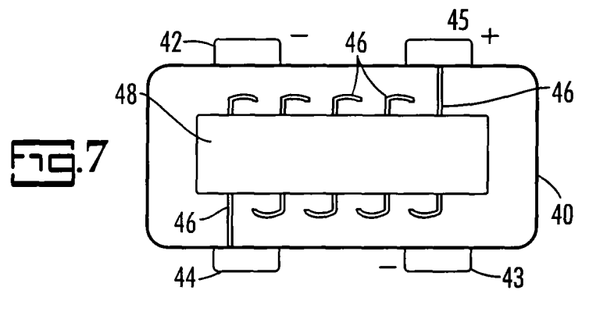
FIG. 7 is a top perspective schematic view of an embodiment of the invention.

An embodiment of the invention is illustrated in top schematic view in FIG. 5. In FIG. 5, an assembly comprising two multilayer ceramic capacitors, 40, is prepared by interleaving conductive plates P1 with conductive plates P2. Conductive plates P1 and P2 are illustrated in FIG. 6, with dielectric there between for the purposes of further discussion. The layered construction is formed and terminations formed wherein terminals 42 and 43 are designated ground and terminals 44 and 45 are designated power. The terminals are preferably fired thick film copper, silver, palladium/silver or a conductive epoxy. An inductor is formed between the power terminals by printing at least the initial portions of a conductive trace, 46, on the surface of the assembly. The conductive trace can be formed by printing at a conductive epoxy and curing the epoxy or by using high intensity light to sinter copper or silver conductors. In its simplest form a conductive trace between terminals 44 and 45 would serve as a low value inductor. However, in many filter applications a larger inductance is required than cannot be realized by using conductive traces alone. This is solved in this embodiment of the invention by forming a higher value inductor using a ferrite. Continuing to FIG. 7, a ferromagnetic or ferrimagnetic material, 48, is formed over the printed portion of the conductive trace. The ferromagnetic or ferrimagnetic material can be formed by dispersing or printing a polymer, such as an epoxy, containing the ferromagnetic or ferrimagnetic material into the desired pattern and heat curing the polymer.

Figure 8:
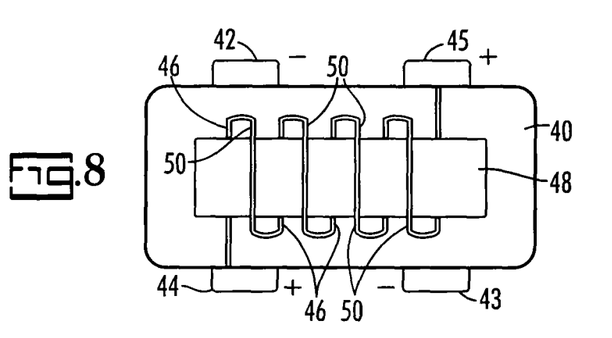
FIG. 8 is a top perspective schematic view of an embodiment of the invention.
Figure 9:
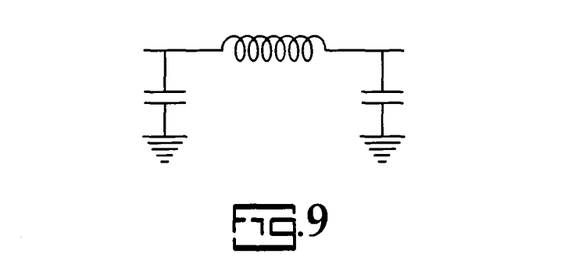
FIG. 9 is an electrical schematic representation of an embodiment of the invention.

With reference to FIG. 8, any remaining portion of the conductive trace is formed over the ferromagnetic or ferrimagnetic material thereby forming, with the initial portions, a winding, 50, around the ferromagnetic or ferrimagnetic material. In one embodiment the entire conductive trace is formed and the ferromagnetic or ferrimagnetic material is not wrapped but the ferromagnetic or ferrimagnetic material is still magnetically coupled to the conductive trace. An electrical schematic diagram of the filter of FIG. 8 is illustrated in FIG. 9.

Figure 10:
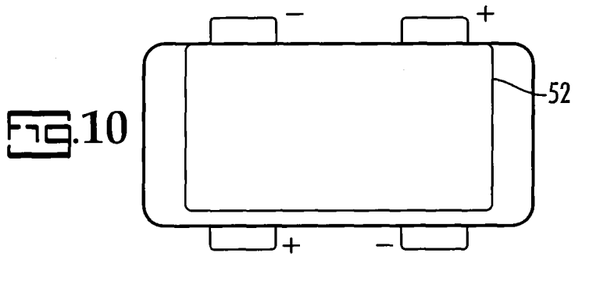
FIG. 10 is a plan view of an internal electrode of an embodiment of the invention.

An embodiment is illustrated in FIG. 10 wherein a non-conductive coating, 52, is applied which protects the inductive components but which allows the terminals to be plated without plating of the conductive traces. The non-conductive coating provides protection from the environment. The non-conductive coating is most preferably applied by printing and curing a polymer coating but other methods could be employed. The polymer coating is not particularly limited.

Figure 11:
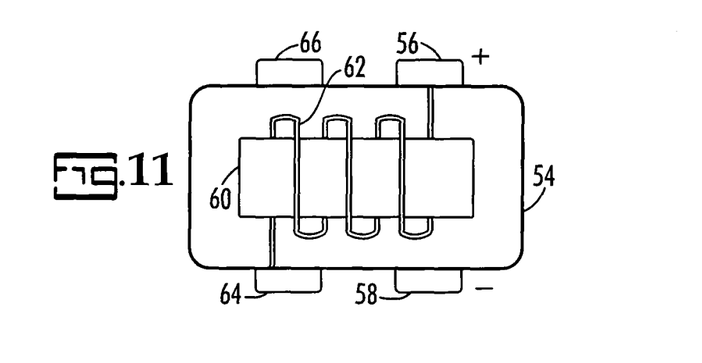
FIG. 11 is a top perspective schematic view of an embodiment of the invention.
Figure 11A:
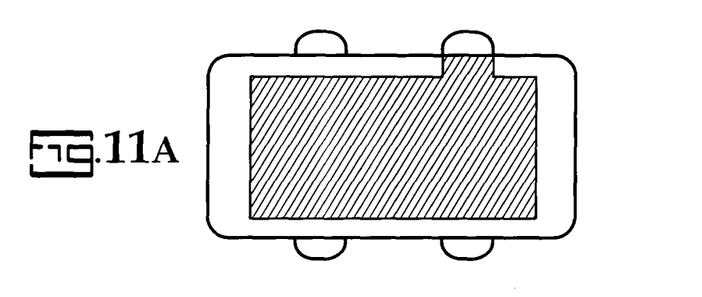
FIGS. 11A and 11B are plan views of internal electrodes of an embodiment of the invention.
Figure 11B:
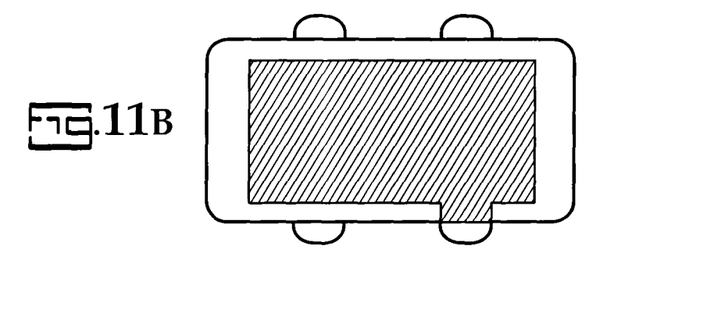
Figure 12:
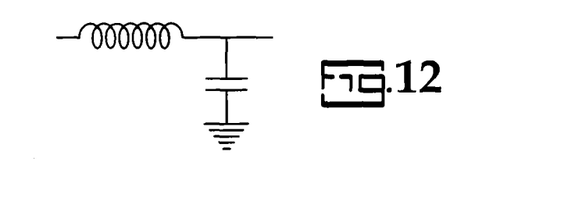
FIG. 12 is an electrical schematic representation of an embodiment of the invention.

The combination of a multi-layered ceramic capacitor with an integral inductor formed on the surface thereof can be extended to form different types of filters based on the configuration. An embodiment of the invention is illustrated in FIG. 11. In FIG. 11, a multilayered ceramic capacitor, 54, with a power termination, 56, and a ground termination, 58, has formed thereon a ferromagnetic or ferrimagnetic material, 60, with a conductive trace, 62, wrapped around the ferromagnetic or ferrimagnetic material. It would be realized that the conductive trace may be on the surface and not wrap the ferromagnetic or ferrimagnetic material even though wrapping is preferred. The conductive trace is in electrical contact between the power termination, 56, and a secondary termination, 64, wherein the secondary termination is only in electrical contact with the capacitor through the conductive trace. An optional but preferred tertiary termination, 66, is not in electrical contact with the capacitor or the conductive trace and is provided for mounting purposes. In this case the internal electrode prints of the multilayer capacitor are represented by FIGS. 11A and 11B respectively. An electrical schematic diagram of the filter illustrated in FIG. 11 is provided in FIG. 12.

Figure 13:
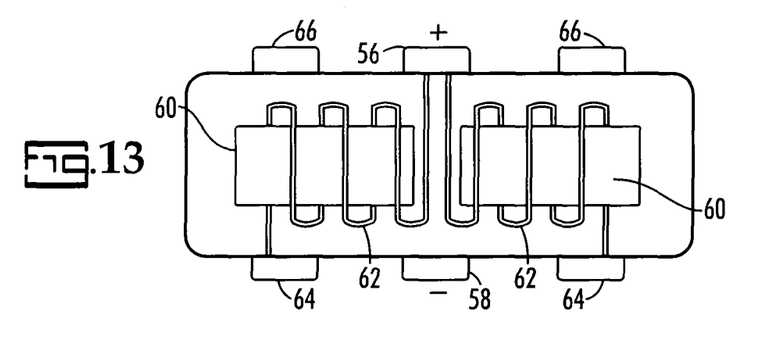
FIG. 13 is a top perspective schematic view of an embodiment of the invention.
Figure 13A:
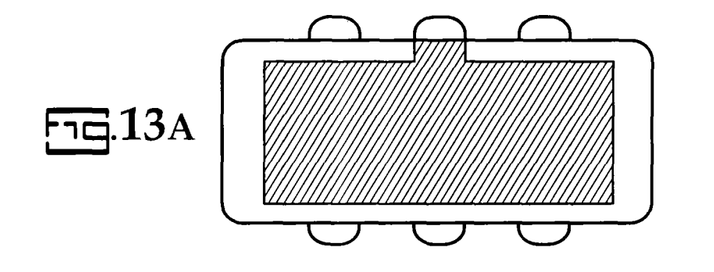
FIGS. 13A and 13B are plan views of internal electrodes of an embodiment of the invention.
Figure 13B:
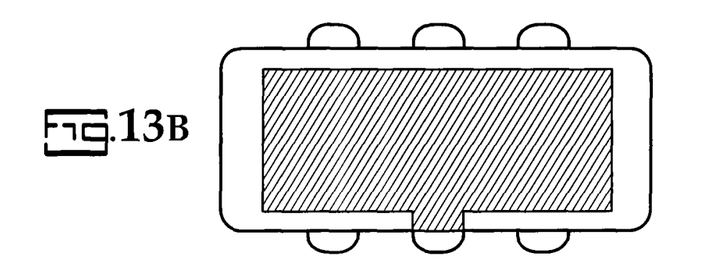
Figure 14:
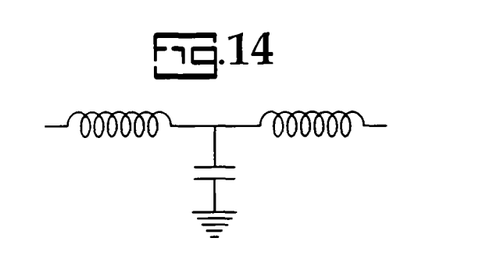
FIG. 14 is an electrical schematic representation of an embodiment of the invention.

An embodiment of the invention is illustrated in to schematic view in FIG. 13. In FIG. 13, a multilayered ceramic capacitor, 54, with a power termination, 56, and a ground termination, 58, has formed thereon two ferromagnetic or ferrimagnetic materials, 60, with separate conductive traces, 62, magnetically coupled to the ferromagnetic or ferrimagnetic material. It would be realized that one or both of the conductive traces may be on the surface or wrapped around the ferromagnetic or ferrimagnetic material with wrapping being preferred. Each conductive trace is in electrical contact between the power termination, 56, and separate secondary terminations, 64, wherein each secondary termination is only in electrical contact with the capacitor through the conductive trace. Optional but preferred tertiary terminations, 66, are not in electrical contact with the capacitor or the conductive trace and are provided to facilitate surface mounting. In this case the internal electrode prints of the multilayer capacitor are represented by FIGS. 13A and 13B respectively. An electrical schematic diagram of the filter illustrated in FIG. 13 is provided in FIG. 14.

The filter of the instant invention provides flexibility with regards to capacitance and inductance. Resonance frequencies can be adjusted over a broad range by adjusting the capacitance by the number of layers in the capacitor and by the overlap areas as well known in the field of multi-layered ceramic capacitor manufacturing. Inductance can be varied by the selection of the type of magnetic material used and the number of windings as well understood in the field of inductor manufacturing. While offering a significant advantage, there is a further desire to have filters which are tunable after the filter is assembled in the circuit. This allows the response to be finely adjusted to a desired level and allows for a reduction in filter to filter variability in an assembled circuit.

Figure 15:
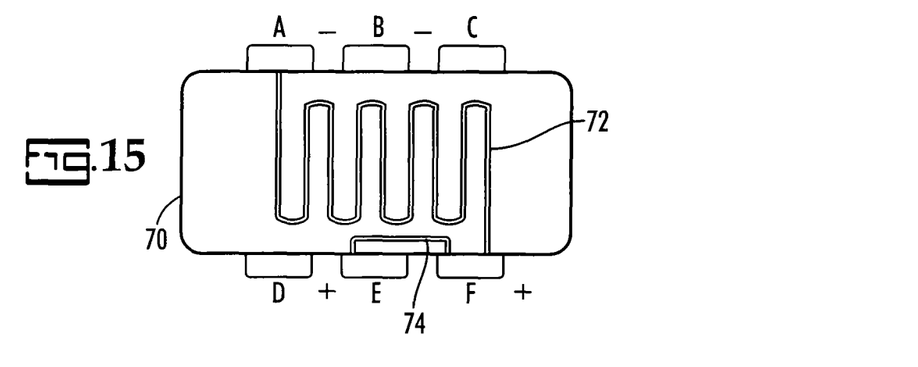
FIG. 15 is a top perspective schematic view of an embodiment of the invention.
Figure 16:
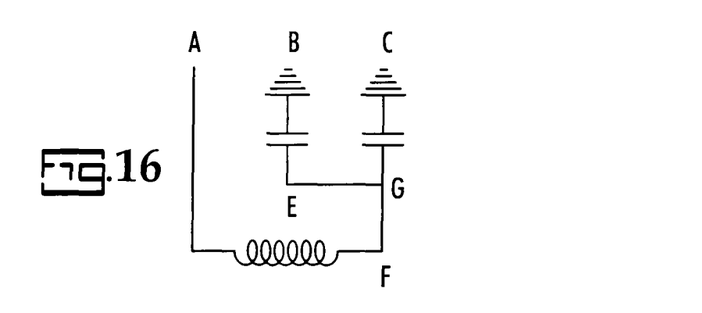
FIG. 16 is an electrical schematic representation of an embodiment of the invention.

A tunable filter will be described with reference to FIG. 15 wherein a tunable filter is illustrated in top schematic view. In FIG. 15, a two capacitor base unit, 70, is provided with one capacitor being between terminations B and E and the other capacitor between terminations C and F. For the purposes of discussion terminations B and C are ground terminations and terminations E and F are power terminations. A conductive trace, 72, is formed between a secondary termination, A, and termination F by printing in the desired pattern or by printing a larger area and laser ablating excess material to achieve the desired conductive area and pattern. A conductive connector, 74, is formed between the power terminations E and F. A ferromagnetic or ferrimagnetic material, not shown, is then formed over the conductive trace. As would be realized the inductor may be wrapped with the conductive trace. A schematic electrical diagram of the resulting filter is illustrated in FIG. 16. The filter can be tuned by altering the conductive connector, 74, to remove contact thereby lowering the overall capacitance. Alternatively, the inductor can be ablated to increase inductance.

Figure 17:
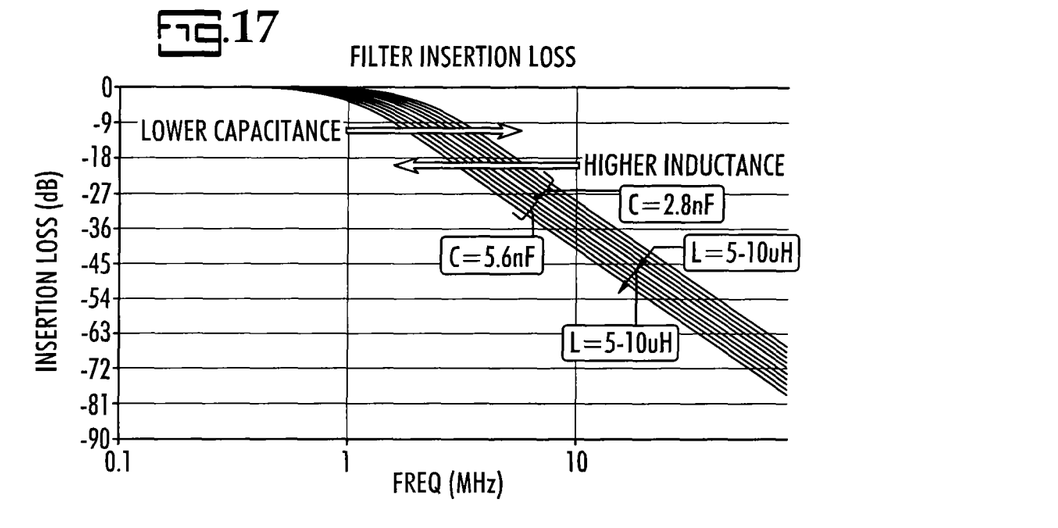
FIG. 17 is a diagrammatic representation of an embodiment of the invention.
Figure 20:
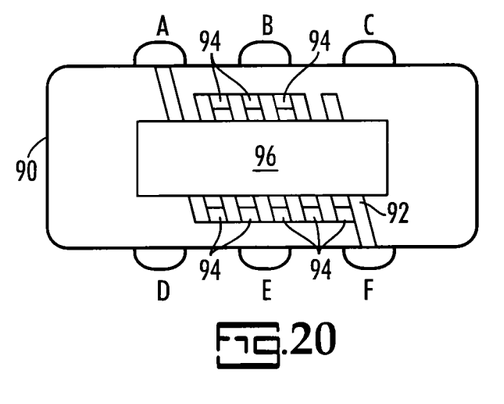
Figure 21:
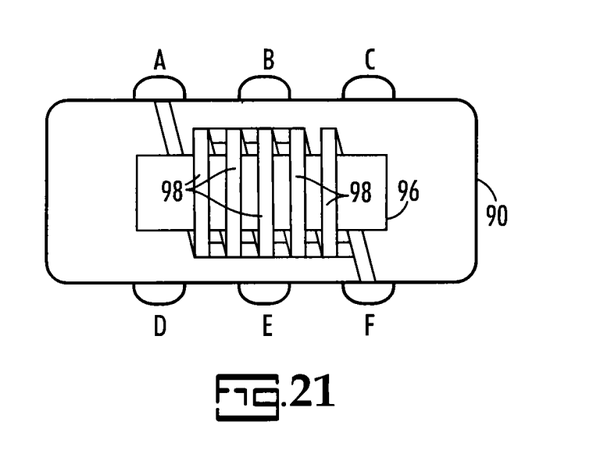
Figure 22:
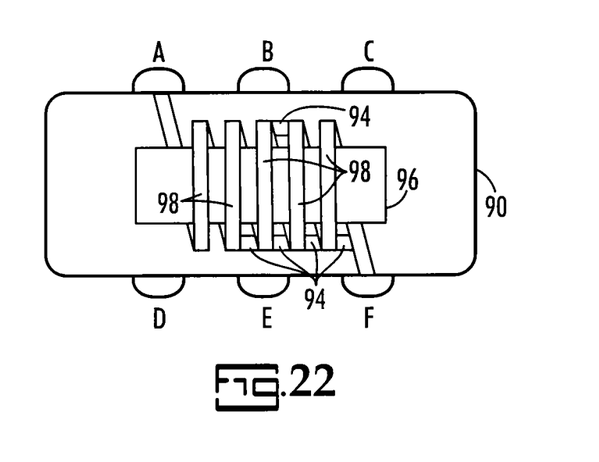

An embodiment of the invention will be described with reference to FIG. 19-22. A capacitor, 90, has printed thereon a first conductive trace, 92, between terminals A and F. As printed the first conductive print comprises connectors, 94, which will be described in more detail herein. A ferromagnetic or ferrimagnetic material, 96, is printed on top of the first conductive trace as shown in FIG. 20. Second conductive traces, 98, are then printed to form conductive paths around the ferromagnetic or ferrimagnetic material as illustrate in FIG. 21. For the purposes of illustration, the embodiment of FIG. 21 would have minimal inductance since the conductive path around the ferromagnetic or ferrimagnetic material is minimal. By selectively ablating away the connections, 94, between traces above and below the ferromagnetic or ferrimagnetic material, 96, the number of turns around the ferrite can be increased for higher inductance as illustrated in FIG. 22. By removing some of the ferrite the inductance can be reduced giving a further means to tune the filter. A representative range of filter insertion loss is illustrated in FIG. 17. In this example the capacitance between B and E and C and F each have a value of 2.8 nF so when both capacitors remain connected the total capacitance is 5.6 nF. Using laser ablation to remove the conductive trace between E and G lowers this to 2.8 nF shifting the insertion loss to higher frequency. Inductances in the range 5 to 10 µH are shown using a laser to increase the number of windings around the ferrite inductor shifts the insertion loss to lower frequency. The frequency response of parameters other than insertion loss can also be adjusted in this way. Some examples of other parameters are output power, noise, AC voltage and impedance.

In any embodiments with multiple capacitive couples the capacitance of each separate capacitance couple can be independently selected. In a tunable capacitor, for example, it may be beneficial to have one capacitive couple which is lower than the other with the lower capacitance capacitor being completely removed from the circuit, by contact ablation, thereby defining the extent of adjustable range of the parallel capacitors.

Figure 18:
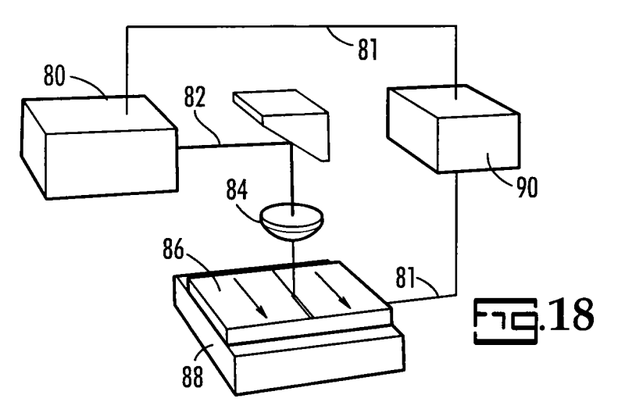
FIG. 18 is a schematic representation of an embodiment of the invention.
Figure 19:
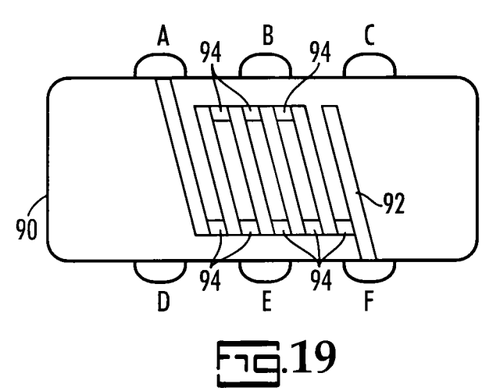
FIGS. 19-22 illustrate an embodiment of the invention.

An embodiment of the invention is illustrated in FIG. 18 wherein a laser source, 80, forms a laser, 82, which is focused by focusing optics, 84, to ablate selective material on a surface of the filter, 86. The position of the filter is translated by a movable platen, 88, such that the specific location desiring to be ablated is impinged by the laser. The electrical characteristics of the filter can be monitored via a measurement circuit with output to an impedance analyzer, 90, that also controls the output of the laser, position of the optics and platen containing the assembled filter through communication links, 81. In this way the ablation can be controlled in a feedback loop whereby the combination of laser energy applied and position is used to ablate a sufficient amount of material at the specified location until a desired result is obtained.

A particular advantage provided by the instant application is the ability to form filters comprising both capacitive and inductive components without the problems typically associated with sintering. Since the sintering can occur on an isolated multilayered ceramic capacitor component followed by formation of the inductive component the materials of construction for the capacitor internal conductors and dielectric is not particularly limited. Base metal capacitors, utilizing base metals such as copper and nickel, are preferred due to cost considerations but the invention can be demonstrated with base metal or precious metal electrodes such as silver, palladium, gold and platinum as well known in the art. Ceramic dielectrics such as barium titanate or calcium zirconate based materials are suitable for demonstration of the invention.

The ferromagnetic and ferrimagnetic materials are not particularly limited herein. Particularly suitable materials for demonstrating the invention are iron oxides $Fe_2O_3$ and $Fe_3O_4$, including $Y-Fe_2O_3$; spinels with the formulae $M\ Fe_2O_4$, where M is a divalent transition metal ion such as Mn, Ni, Co, Zn, Cu, Mg, mixtures of these, or even $Fe^{3+}$ compensated with $Li^+$; magneto plumbite oxides with the generic formula $M'Fe_{12}O_{19}$ where M' can be a divalent ion such as Ba, Sr or Pb; Magnetic garnets with a generic formula of $M''Fe_5O_{12}$ where M'' can be Y, another rare earth element, Al, Ca, V or Bi or mixtures of these. These materials may also contain additions of other materials such as Si to further modify there magnetic properties. Spinets containing Ni and Mn are particularly suitable for filters for use at radiofrequencies.

The external terminations are not particularly limited herein with terminations typically used in the manufacture of multilayered ceramic capacitors being suitable for demonstration of the invention.

Other electronic components may be incorporated into the circuit to augment the filter such as resistors parallel the capacitors to allow safe discharge of the device to ground. Other components such as fuses and the like may be included as an integral component, a parallel component or a serial component may be included.

The invention has been described with reference to the preferred embodiments without limit thereto. One of skill in the art would realize additional embodiments and improvements which are not specifically set forth but which are within the scope of the invention as more specifically set forth in the claims appended hereto.

The invention claimed is:

1. An electronic filter comprising:
   a capacitor comprising:
      a plurality of first planar internal electrodes in electrical contact with a first termination;
      a plurality of second planar internal electrodes in electrical contact with a second termination; and
      a dielectric between said plurality of first planar internal electrodes and said plurality of second planar internal electrodes;
   a third termination;
   a conductive trace over a surface of said capacitor; wherein said conductive trace is between said third termination and said first termination; and
   a ferromagnetic or ferrimagnetic material in a heat cured polymer on said surface of said capacitor and coupled to said conductive trace, wherein a portion of said conductive trace is between said surface of said capacitor and said ferromagnetic or ferrimagnetic material.

2. The electronic filter of claim 1 wherein a first planar internal electrode of said plurality of first planar internal electrodes and a second planar internal electrode of said plurality of second planar internal electrodes are in a common plane.

3. The electronic filter of claim 2 further comprising a floating electrode between a first plane comprising the plurality of first planar internal electrodes and an adjacent second plane comprising the plurality of second planar internal electrodes.

4. The electronic filter of claim 1 wherein said plurality of first planar internal electrodes and said plurality of second planar internal electrodes are interleaved.

5. The electronic filter of claim 1 further comprising:
   a plurality of third planar internal electrodes in electrical contact with said third termination; and
   a plurality of fourth planar internal electrodes in electrical contact with a fourth termination.

6. The electronic filter of claim 5 wherein a third planar internal electrode of said plurality of third planar internal electrodes and a fourth planar internal electrode of said plurality of fourth planar internal electrodes are in a common plane.

7. The electronic filter of claim 6 further comprising a floating electrode between a first plane comprising the plurality of first planar internal electrodes and an adjacent second plane comprising the plurality of second planar internal electrodes.

8. The electronic filter of claim 5 wherein said plurality of third planar internal electrodes and said plurality of fourth planar internal electrodes are interleaved.

9. The electronic filter of claim 1 further comprising:
   a second conductive trace over said surface of said capacitor; wherein said second conductive trace is between said first termination and a fourth termination; and
   a second ferromagnetic or ferrimagnetic material coupled to said second conductive trace.

10. The electronic filter of claim 1 further comprising:
    a plurality of third planar internal electrodes in electrical contact with said first termination; and
    a plurality of fourth planar internal electrodes interleaved with said plurality of third planar internal electrodes; wherein said plurality of fourth planar internal electrodes are in electrical contact with a fourth termination.

11. The electronic filter of claim 10 wherein said plurality of third planar internal electrodes are in electrical contact with said first termination by a conductive connector.

12. The electronic filter of claim 11 wherein said conductive connector is a second conductive trace over said surface of said capacitor.

13. The electronic filter of claim 1 further comprising a conductive shell on said electronic filter.

14. The electronic filter of claim 1 further comprising a non-conductive shell over at least said ferromagnetic or ferrimagnetic material.

15. An electronic filter comprising: a capacitor comprising:
a plurality of first planar internal electrodes in electrical contact with a first termination;
a plurality of second planar internal electrodes in electrical contact with a second termination;
a plurality of common planes, wherein for each common plane of said plurality of common planes a first planar internal electrode of said plurality of first planar internal electrodes and a second planar internal electrode of said plurality of second planar internal electrodes are coplanar;
a plurality of third planar internal electrodes interleaved with said plurality of common planes;
a dielectric between each said common plane and said plurality of third planar internal electrodes;
a third termination;
a conductive trace over a surface of said capacitor; wherein said conductive trace is between said third termination and said first termination; and
a ferromagnetic or ferrimagnetic material coupled to said conductive trace;
a second conductive trace over said surface of said capacitor; wherein said second conductive trace is between said first termination and a fourth termination; and
a second ferromagnetic or ferrimagnetic material coupled to said second conductive trace.

16. An electronic filter comprising: a capacitor comprising:
a plurality of first planar internal electrodes in electrical contact with a first termination;
a plurality of second planar internal electrodes in electrical contact with a second termination;
a plurality of common planes, wherein for each common plane of said plurality of common planes a first planar internal electrode of said plurality of first planar internal electrodes and a second planar internal electrode of said plurality of second planar internal electrodes are coplanar;
a plurality of third planar internal electrodes interleaved with said plurality of common planes;
a dielectric between each said common plane and said plurality of third planar internal electrodes;
a third termination;
a conductive trace over a surface of said capacitor; wherein said conductive trace is between said third termination and said first termination; and
a ferromagnetic or ferrimagnetic material coupled to said conductive trace, wherein a portion of said conductive trace is between said surface and said ferromagnetic or ferrimagnetic material.

17. The electronic filter of claim 16 further comprising a non-conductive shell over at least said ferromagnetic or ferrimagnetic material.

18. The electronic filter of claim 16 further comprising a conductive shell on said electronic filter.

19. The electronic filter of claim 16 further comprising:
said plurality of third planar internal electrodes in electrical contact with said third termination; and
a plurality of fourth planar internal electrodes in electrical contact with a fourth termination.

20. The electronic filter of claim 19 wherein said electrical contact with said third termination comprises a conductive connector.

21. The electronic filter of claim 20 wherein said conductive connector is a second conductive trace on said surface of said capacitor.

22. A method of providing an electronic circuit comprising:
providing an electronic filter comprising: a capacitor comprising:
a plurality of first planar internal electrodes in electrical contact with a first termination;
a plurality of second planar internal electrodes in electrical contact with a second termination; and
a dielectric between said plurality of first planar internal electrodes and said plurality of second planar internal electrodes;
a plurality of third planar internal electrodes in electrical contact with said first termination;
a plurality of fourth planar internal electrodes in electrical contact with a fourth termination;
a third termination;
a conductive trace over a surface of said capacitor;
wherein said conductive trace is between said third termination and said first termination;
a ferromagnetic or ferrimagnetic material in a heat cured polymer on said surface of said capacitor and coupled to said conductive trace, wherein a portion of said conductive trace is between said surface of said capacitor and said ferromagnetic or ferrimagnetic material; and
mounting said electronic filter on a circuit trace board.

23. The method of providing an electronic circuit of claim 22 further comprising measuring insertion loss, output power, noise, AC voltage or impedance of said electronic circuit.

24. The method of providing an electronic circuit of claim 23 further comprising ablating at least one of said ferromagnetic or ferrimagnetic material or said conductive trace to adjust said insertion loss, output power, noise, AC voltage or impedance of said electronic circuit.

25. The method of providing an electronic circuit of claim 24 wherein said ablating is by laser ablation.

26. The method of providing an electronic circuit of claim 22 further comprising forming a conductive shell on said electronic filter.

27. The method of providing an electronic circuit of claim 26 further comprising grounding said conductive shell.

28. A method of making an electronic filter comprising:
forming a stacked arrangement comprising a plurality of first conductive plates in electrical contact with a first termination and a plurality of second conductive plates in electrical contact with a second termination and a dielectric between said plurality of first conductive plates and said plurality of second conductive plates;
forming a third termination on said stacked arrangement; and
forming a conductive trace over said stacked arrangement wherein said conductive trace is electrically connected between the first termination and the second termination and said conductive trace is magnetically coupled to a ferromagnetic or ferrimagnetic material and at least a portion of said conductive trace is between said stacked arrangement and said ferromagnetic or ferrimagnetic material.

29. The method of making an electronic filter of claim 28 further comprising impinging at least one of said conductive trace or said ferromagnetic or ferrimagnetic material.

30. The method of making an electronic filter of claim 28 further comprising:
forming a plurality of third planar internal electrodes to be in electrical contact with said third termination;
forming a plurality of fourth planar internal electrodes to be in electrical contact with a fourth termination; and
wherein said dielectric is formed between said plurality of first planar internal electrodes and said plurality of second planar internal electrodes.

31. The method of making an electronic filter of claim 28 further comprising:
  forming a second conductive trace over a surface of said capacitor, wherein said second conductive trace is between said first termination and a fourth termination; and
  forming a second ferromagnetic or ferrimagnetic material coupled to said second conductive trace.

32. The method of making an electronic filter of claim 28 further comprising:
  forming a plurality of third planar internal electrodes to be in electrical contact with a said first termination; and
  forming a plurality of fourth planar internal electrodes to be in electrical contact with a fourth termination.

33. The method of making an electronic filter of claim 32 wherein said plurality of third planar internal electrodes are in electrical contact with said first termination by a conductive connector.

34. The method of making an electronic filter of claim 33 wherein said conductive connector is a second conductive trace on said surface of said capacitor.

35. The method of making an electronic filter of claim 28 further comprising forming a conductive shell on said electronic filter.

36. The method of making an electronic filter of claim 28 further comprising forming a non-conductive shell over at least said ferromagnetic or ferrimagnetic material.

* * * * *